United States Patent
Hickey et al.

(10) Patent No.: US 11,747,554 B2
(45) Date of Patent: Sep. 5, 2023

(54) CARRIER BASED LASER ASSEMBLY AND METHOD OF ASSEMBLY THEREOF WITH PHOTONIC INTEGRATED CIRCUIT

(71) Applicant: RANOVUS INC., Kanata (CA)

(72) Inventors: Ryan Murray Hickey, Stittsville (CA); Douglas J. S. Beckett, Kanata (CA); Jeffrey Otha Hutchins, Sunnyvale, CA (US)

(73) Assignee: RANOVUS INC., Kanata (CA)

( * ) Notice: Subject to any disclaimer, the term of this patent is extended or adjusted under 35 U.S.C. 154(b) by 0 days.

(21) Appl. No.: 17/323,406

(22) Filed: May 18, 2021

(65) Prior Publication Data
US 2021/0364694 A1    Nov. 25, 2021

Related U.S. Application Data

(60) Provisional application No. 63/029,031, filed on May 22, 2020.

(51) Int. Cl.
*G02B 6/12* (2006.01)

(52) U.S. Cl.
CPC ...... *G02B 6/12* (2013.01); *G02B 2006/12121* (2013.01)

(58) Field of Classification Search
CPC ............ G02B 6/12; G02B 2006/12121; G02B 6/4238; G02B 6/4221; G02B 6/4239; G02B 6/4224; G02B 6/4225; G02B 6/4212; H01S 5/021; H01S 5/02326; H01S 5/02345; H01S 5/023; H01S 5/0237; H01S 5/0238; H01S 5/04257; H01S 5/0234; H01S 5/0232; H01S 5/0225; H01S 5/02315
See application file for complete search history.

(56) References Cited

U.S. PATENT DOCUMENTS

| 10,775,561 B2* | 9/2020 | Meister ............. G02B 6/12004 |
| 2009/0154872 A1 | 6/2009 | Sherrer et al. |
| 2019/0179091 A1 | 6/2019 | Kinghorn et al. |
| 2019/0317276 A1 | 10/2019 | Iida et al. |
| 2020/0041721 A1 | 2/2020 | Yu et al. |
| 2020/0091676 A1* | 3/2020 | Karplus ............. H01S 5/02253 |

FOREIGN PATENT DOCUMENTS

CN    109669248 A    4/2019

OTHER PUBLICATIONS

Hashimoto, Toshikazu, et al. "Hybrid integration of spot-size converted laser diode on planar lightwave circuit platform by passive alignment technique." IEEE Photonics Technology Letters 8.11 (1996): 1504-1506.

\* cited by examiner

*Primary Examiner* — John Bedtelyon
(74) *Attorney, Agent, or Firm* — PERRY + CURRIER, INC.

(57) ABSTRACT

A carrier laser device assembly is provided in which a visible region of a laser that includes an output portion and/or output portion of a waveguide of the laser is visible to an imaging system when the laser is attached to a carrier. The laser may be burned-in and/or tested prior to attachment to a photonic integrated circuit. The output portion and/or output portion of waveguide may be aligned with a corresponding input portion and/or input portion of a waveguide of the PIC as the laser assembly is being attached to the PIC via imaging of the visible portion by the imaging system.

17 Claims, 13 Drawing Sheets

CARRIER BASED LASER ASSEMBLY AND METHOD OF ASSEMBLY THEREOF WITH PHOTONIC INTEGRATED CIRCUIT

BACKGROUND

Increasingly, photonic and/or silicon photonics based optical engines require multiple laser sources to support multiple lanes of data. Often, the need for a greater number of lasers is, for example, because higher optical reflection tolerance often dictates lower output power that, in turn, supports fewer channels. This high number of lasers necessitates very high single-device laser yield in the integrated optical engine because the cumulative yield is compounded by the number of devices used.

Furthermore, the lowest-loss and most cost-effective assembly methods require that the laser light source is directly attached to silicon photonics.

BRIEF DESCRIPTION OF THE DRAWINGS

For a better understanding of the various examples described herein and to show more clearly how they may be carried into effect, reference will now be made, by way of example only, to the accompanying drawings in which.

Figure 1:
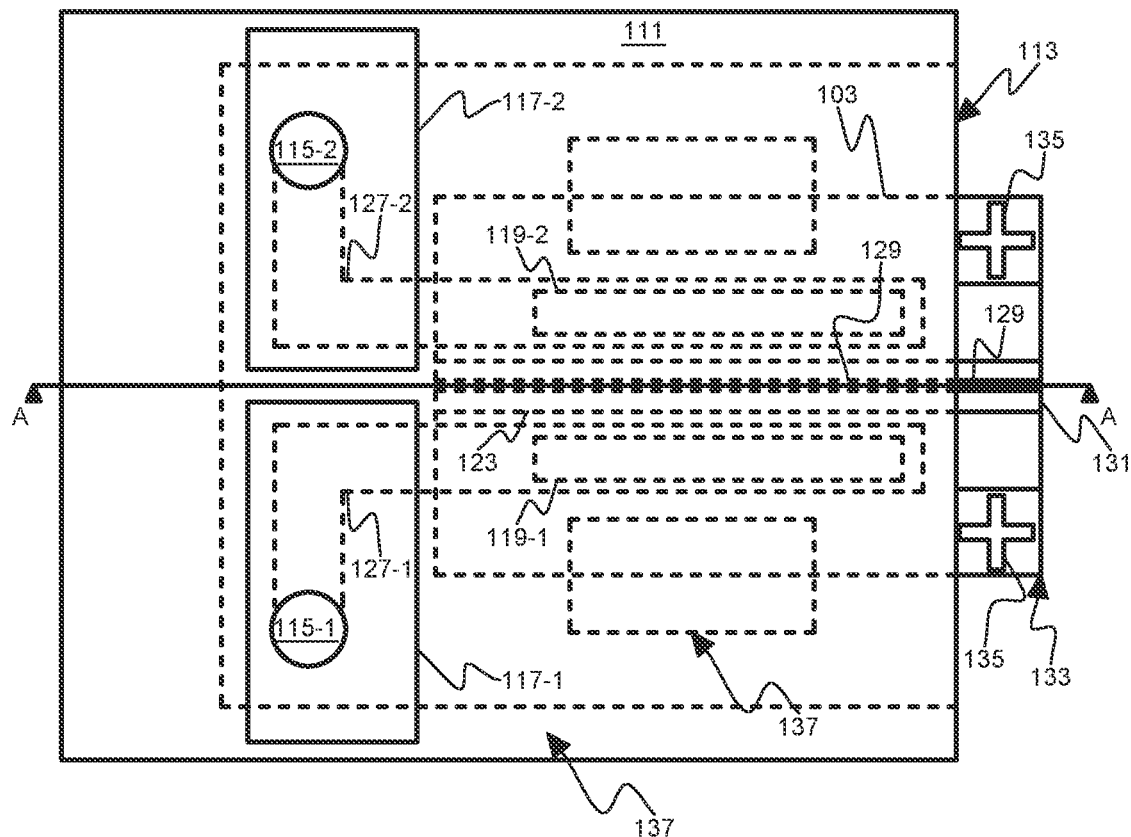
FIG. 1 depicts a top view of an example device that includes a carrier and a laser, in accordance with some examples.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Current attaching processes of laser devices to photonic integrated circuits (PICs) are known to have a significant probability of causing the laser characteristics to degrade, or of causing failure during the operating life if the laser is not burned-in prior to attachment. This is particularly true if high-temperatures, such as those used for soldering, are used in the attaching process. Parallel, non-WDM (wavelength-division multiplexing) systems, typically require that one laser per "lane" be used. For example, 100, 400 and 800G systems could require 1, 4 and 8 lasers for each optical layout. Advanced packaged solutions for monolithic single die electro-optics involve placing these lasers at an ePIC (electrical photonics integrated circuit), and possibly at an ePIC wafer. For stability and reliability, such lasers may require soldering (e.g. Au—Sn soldering), as well as a post-attach burn-in for the lasers to ensure reliability of the full multi-laser assembly. However, such post-attach burn-in may result in failure of the laser which can result in failure of the entire laser assembly. In particular, burning-in laser devices after attached to a photonic integrated circuit (PIC) is problematic due to the possibility of the laser devices failing after attachment which may lead to failure of the entire PIC, along with any previously attached lasers, and packaged assembly and hence a lowered yield in producing PIC-laser assemblies. Indeed, maximizing yield of optical engines that includes one or more lasers and a PIC is paramount for reducing cost of production, and with multiple soldered and burned-in lasers that may be required per optical engine-die, the individual assembled laser die yield becomes critical.

One approach is to provide a flipped active region ("p-down") soldered to a PIC die with a mode-matched facet-to-facet coupling arrangement. However, a problem with monolithic PIC die systems with flipped LD configurations, is that the soldering process takes place at the die or wafer level. The flipped laser for facet-coupling requires the solder joint to be within microns of the active region. The additional stresses and stress non-uniformity of this solder joint will impact the optical performance of the lasing device. The resulting overall yield of a device that uses multiple lasers may be catastrophically low.

An additional problem that results in further yield related impact is optical alignment. Facet-to-facet coupling can require sub-micron level accurate placement of a laser die in the flipped arrangement while being soldered at temperatures greater than 300° C. This process can require very expensive assembly equipment, and long development times.

Hence, provided herein is a process that allows a laser assembly to be burned-in and screened by testing after soldering (e.g. attaching a lasing device to a carrier via soldering) but before the assembly is attached to the photonics and/or silicon photonics, for example to avoid device failures after attaching the laser assembly to the photonics and/or silicon photonics.

Also provided herein is a laser assembly that may increase yield of laser-PIC assemblies as a laser is first attached to a carrier distinct from a PIC. Dimensions and/or configurations of the carrier are selected such that the carrier is compatible with subsequent attachment to a PIC.

Also provided herein is a technique that may reduce the machine assisted alignment requirements in which an output portion and/or output facet of a waveguide of the laser is visible when the laser is attached to the carrier. For example, dimensions and/or configurations of a combination of a laser and a carrier to which the laser is attached (e.g. a laser assembly) are selected such that an output portion and/or output facet of waveguide is not eclipsed by the carrier and/or is visible to an external vision system when the laser is attached to the carrier; hence, the output portion and/or output facet of waveguide may be aligned with a corresponding input portion and/or input facet of a waveguide of the PIC as the laser assembly is being attached to the PIC. Put another way, the output of the laser on the carrier is generally visible during the attaching of the laser assembly onto the PIC and/or is not eclipsed by the PIC.

Also provided herein is a technique that may reduce machine assisted alignment requirements, for example by removing one of the alignment axes, using semiconductor-based datum reference planes at both the PIC and laser assembly that are correlated to vertical optical planes. When the laser assembly is flipped and brought into contact with the PIC, these physical planes mate, which may result in the optical planes being aligned.

In particular, provided herein is a device that includes a carrier with a laser attached thereto, the laser having a region (e.g. a visible region) which is visible to an external vision system and that includes an output facet of the laser, as well as a portion of a waveguide from a lasing device of the laser to the output facet, and allows the laser to be more easily positioned at a surface of a PIC. For example, the visible region may protrude from the carrier and the laser may be positioned in a cavity of the PIC as the laser is being positioned at the surface of the PIC, with the carrier interfacing with the surface of the PIC. A method for assembling the device with the PIC is also provided that relies on the visible portion for alignment of the output facet, and the associated waveguide, with an input facet, and respective associated waveguide, of the PIC.

In particular, an aspect of the present specification provides device comprising: a carrier comprising: a first side, a second side opposing the first side, and an edge joining the first side and the second side; through-carrier vias (TCVs) from the first side to the second side, the TCVs including electrical connections therethrough; first electrical contacts for the electrical connections at the first side; and second electrical contacts for the electrical connections at the second side; and a laser attached to the second side of the carrier, the laser comprising: a body supporting components of the laser; a lasing device configured to produce light, the lasing device located at a respective side of the body attached to the second side of the carrier; respective electrical connections from the second electrical contacts to the lasing device; and a protruding region of the body protruding the edge of the carrier, the body otherwise having a smaller footprint than the carrier; and an output portion configured to convey light from the lasing device out of the laser, the output portion located at the protruding region of the body.

Another aspect of the present specification provides a device comprising: a photonic integrated circuit (PIC) including a waveguide, an input portion to the waveguide; and a cavity, the input portion located at an interior edge of the of the cavity; and a laser device comprising: a carrier comprising: opposing sides joined by an edge; through-carrier-vias (TCVs) between the opposing sides, the TCVs including electrical connections therethrough; and a laser attached to a given side of the opposing sides of the carrier, the laser comprising: a body supporting components of the laser; a lasing device configured to produce light for the PIC, the lasing device located between the given side of the carrier and the body; respective electrical connections from the lasing device to the electrical connections of the TCVs; and an output portion and respective waveguide configured to convey the light from the lasing device out of the laser, a protruding region of the body, supporting the output portion, and the respective waveguide, protruding the edge of the carrier, the body otherwise having a smaller footprint than the carrier, the body located in the cavity of the PIC with the output portion and the respective waveguide respectively aligned with the input portion and the waveguide of the PIC, the carrier attached to the PIC, the carrier supporting the body in the cavity.

Yet another aspect of the present specification provides a method comprising: burning-in a laser device, the laser device comprising: a laser attached to a carrier, a visible region of the laser, that includes an output portion and at least a portion of a waveguide configured to convey light out of the laser, the visible region being visible to an imaging system external to the laser device; positioning, using one or more of the imaging system and a robotic device, the laser device at a surface of a photonic integrated circuit (PIC) such that respective optical axes of the output portion and an input portion of a waveguide of the PIC, are about aligned; and attaching the carrier to the surface of the PIC.

Yet another aspect of the present specification provides a device comprising: a photonic integrated circuit (PIC) including a waveguide and an input portion to the waveguide; and a laser device attached to the PIC, the laser device comprising: a carrier; a laser attached to the carrier, the laser comprising: a lasing device, a respective waveguide, an output portion, and a visible region of the laser that includes the output portion and at least a portion of the waveguide configured to convey light out of the laser via the output portion to the input portion of the PIC, the output portion and the input portion being optically coupled via an optical coupling device, the visible region being visible to an imaging system external to the laser device.

While reference is made hereafter to "facets", for example of an output facet and an input facet of waveguides, such terms may be interchangeably referred, hereafter, respectively, as an output portion (e.g. of a waveguide) and an input portion (e.g. of a waveguide), though the terms output portion and input portion (e.g. of a waveguide) are understood to encompass other structures and/or configurations for emitting or receiving light at a waveguide (e.g. other than facets). For example, optical coupling between waveguides, described as occurring via "facets", may alternatively occur via at any suitable input portions and output portions of the waveguides, including, but not limited to, evanescent coupling between a polymer waveguide (and/or a three-dimensional printed polymer waveguide) and a laser waveguide and/or PIC waveguide.

Figure 2:
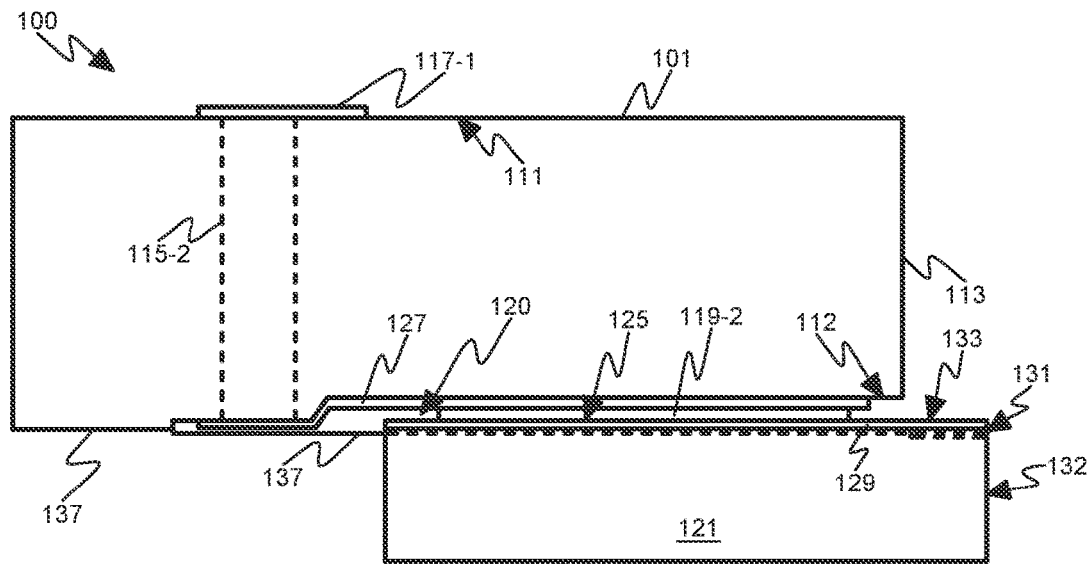
FIG. 2 depicts a side view of the example device of FIG. 1, in accordance with some examples.
Figure 3:
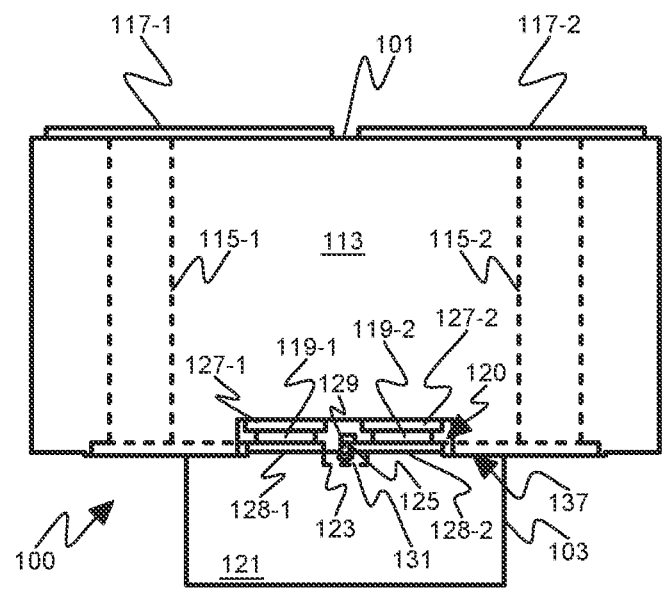
FIG. 3 depicts an end view of the example device of FIG. 1, in accordance with some examples.

Attention is directed to FIG. 1, FIG. 2, and FIG. 3 which respectively depict a top view, a side-cross-sectional view (e.g. through a line A-A of FIG. 1), and an end view of a laser device 100 (interchangeably referred to hereafter as the device 100 and/or a laser device assembly 100 and/or an assembly 100).

The device 100 comprises a carrier 101 and a laser 103. As will be explained in more detail below, the laser device 103 is attached to, and/or assembled with, the carrier 101 and laser device assembly 100 burned-in (e.g. and tested) prior to attachment to a PIC.

The carrier 101 generally comprises any suitable material which may include, but is not limited to, silicon, silicon nitride, and the like, and/or any other suitable material (e.g. another suitable crystalline material, a suitable ceramic and the like), etched and/or cut and/or formed and/or cleaved into a suitable shape. Hence, in a particular example, the carrier 101 may comprise a silicon carrier. The carrier 101 generally acts as a mechanical support mechanism for the laser 103 as described in more detail below. As best seen in FIG. 1 and FIG. 2, a portion of the laser 103 protrudes relative to the carrier 10, and components of the laser 103 in FIG. 1 which are obscured by the carrier 101 are depicted in outline to show relative positions thereof to the remainder of the components of the device 100.

The carrier 101 generally comprises: a first side 111, a second side 112 opposing the first side 111, and an edge 113 joining the first side 111 and the second side 112. It is understood that while one edge 113 joining the first side 111 and the second side 112 is numbered and described herein, other edges join the sides 111, 112; for example, as depicted, the sides 111, 112 have a generally rectangular shape and hence are joined by four edges including the edge 113. However, the carrier 101 may have any suitable shape and hence any suitable number of edges.

The carrier 101 further comprises through-carrier vias (TCVs) 115-1, 115-2 (e.g. interchangeably referred to herein, collectively, as TCVs 115 and, generically, as a TCV 115) from the first side 111 to the second side 112. In FIG. 2 and FIG. 3, the TCVs 115 are depicted in outline indicating that they are located inside the carrier 101.

When the carrier 101 comprises a silicon carrier, the TCVs may comprise through-silicon vias (TSVs). The TCVs generally including electrical connections therethrough; for example, the TCVs may be filled with conducting material, such as aluminum, gold, and the like. The carrier 101 further comprises first electrical contacts 117-1, 117-2 (e.g. electrical contacts 117 and/or an electrical contact 117) for the electrical connections at the first side 111; and second electrical contacts 127-1, 127-2 (e.g. electrical contacts 127 and/or an electrical contact 127) for the electrical connections at the second side 112. As best seen in FIG. 3, the electrical contacts 127 are electrically connected to respective laser electrical connections 128-1, 128-2 (e.g. electrical connections 128 and/or an electrical connection 128 to the lasing device 123) via respective solder connections 119-1, 119-2 (e.g. solder connections 119 and/or a solder connection 119), for example during assembly of the laser 103 to the carrier 101. As also best seen in FIG. 3, the carrier 101 further comprises a recess 120 at the second side 112, and the solder connections 119 may be located in the recess 120 at the second side 112 and similarly a portion of the electrical contacts 127 that connect to the solder connections 119 may also be located in the recess 120 at the second side 112. However the electrical connections 128 and the electrical contacts 127 may be electrically connected in any suitable manner (e.g. with electrical connections different from solder connections, for example bonded wire, conductive adhesive, contact pins, and the like).

It is understood that the TCVs 115 may not (e.g. as depicted) be aligned with the electrical connections 128 and/or solder connections 119 and hence, the electrical contacts 127 may include electrical traces and the like between an end of the electrical connections in the TCVs 115 at the second side 112 and electrical connections 128 and/or the solder connections 119. Hence, when power, voltage, and the like, are supplied to the electrical contacts 117, the power, voltage, and the like are fed to corresponding electrical connections 128 via the electrical connections in the TCVs 115, corresponding electrical contacts 127 (e.g. and corresponding traces thereof), and corresponding solder connections 119, and the like. For example, the electrical contact 117-1 and the electrical connection 128-1 are electrically connected, and the electrical contact 117-2 and the electrical connection 128-2 are electrically connected. The electrical contacts 117, and the electrical contacts 127 may be formed from a same and/or similar material as the electrical connections in the TCVs 115, however the electrical contacts 117 are of a shape and size for connecting a power and/or voltage source thereto, and the electrical contacts 127 are of a shape and size such that corresponding electrical connections 128 of the laser 103 may be soldered to electrical contacts 127 via the solder connections 119. In some examples, the electrical connection 128-1 comprises an "N" electrical connection to the lasing device 123, and the electrical connection 128-2 comprises a "P" electrical connection to the lasing device 123.

As best seen in FIG. 1 and FIG. 2, the laser 103 is generally attached to the second side 112 of the carrier 101, for example as described in more detail below (e.g. via soldering using the solder connections 119, and/or other suitable attachment mechanisms and/or material). In particular, the laser 103 comprises: a body 121 supporting components of the laser 103; and a lasing device 123 configured to produce light, the lasing device 123 located at a respective side 125 of the body 121 attached to the second side 112 of the carrier 101. In particular, as described in more detail below, the lasing device 123 may be combined with and/or at least partially include a waveguide 129 and/or at least partially be combined with the waveguide 129, and/or the lasing device 123 and the waveguide 129 may be coincident such that the waveguide 129 guides light from the lasing device 123 to an output facet 131. In some examples, The lasing device 123 may include an active guided region and a passive waveguiding region (e.g. the waveguide 129), where a lasing gain region of the lasing device 123 makes up only a portion of a lengthwise section of the lasing device 123 (e.g. the waveguide 129 may comprise a front passive waveguide section of the lasing device 123); regardless the lasing device 123 may generally include an active lasing section that outputs light to an active guided region, which guides light to the passive region, and/or to the waveguide 129.

The lasing device 123 may comprise any suitable lasing device 123 and may be formed at the body 121 and/or the waveguide 129 using any suitable process. For example, the body 121 may comprise InP (Indium Phosphide) that is p-doped at the side 125 (e.g. and n-doped at an opposite side), and the lasing device 123 may comprise an InP lasing device formed at the p-doped side of the InP body 121. As such, the laser 103 may be referred to as an InP P-Up laser and/or assembly, and the like.

While not described in detail, it is understood that the laser 103 may be fabricated using techniques familiar to those of skill in the art including, but not limited to photolithography, etching, and the like (e.g. beginning with doped InP and the like).

As has already been described, the laser 103 further comprises respective electrical connections 128 from electrical contacts 127 to the lasing device 123 (e.g. via the solder connections 119). For example, the electrical contact 127-1 may be soldered to the electrical connection 128-1 via the solder connection 119-1, and the electrical contact 127-2 may be soldered to the electrical connection 128-2 via the solder connection 119-2. Hence, the laser 103 may be at least partially attached to the carrier 101 via soldering of the electrical contacts 127 and the electrical connection 128 via respective solder connections 119. However, the laser 103 may be at least partially attached to the carrier 101 via any suitable technique and/or material including, but not limited to: bonded wire, conductive adhesive, contact pins, solder and the like.

Put another way, electrical contacts 117 and/or the electrical contacts 127 (e.g. electrical traces thereof) are connected to electrical components of the lasing device 123 which cause the lasing device 123 to lase and emit light. Hence, the electrical contact 117-1 may be electrically connected to an "N" electrical connection 128-1 of the lasing device 123 via the TCV 115-1, the electrical contact 127-1, and the solder connection 119-1, and the electrical contact 117-2 may be electrically connected to a "P" electrical connection 128-2 of the lasing device 123 via the TCV 115-2, the electrical contact 127-2, and the solder connection 119-2, and the lasing device 123 may hence be operated via the electrical contacts 117.

As has already been described, the laser 103 further comprises a waveguide 129 which conveys light from the lasing device 123 to the output facet 131 such that the light from the lasing device 123 may exit the laser 103. As has already been described, the waveguide 129 may comprise a passive waveguide region of the lasing device 123. As depicted, the output facet 131 may generally be about perpendicular to the second side 112 of the carrier 101 and is configured to convey light from the lasing device 123 out of the laser 103 (e.g. via the waveguide 129). However, while the output facet 131 is depicted as perpendicular to the second side 112 of the carrier 101, the output facet 131 may be at any suitable angle to the second side 112 (e.g. in a range of about 0° to about 8° (e.g. off of perpendicular) and/or any other suitable angle).

As depicted, the body 121 generally comprises a protruding region 133, supporting the output facet 131 and protruding the edge 113 of the carrier 101. The protruding region 133 may alternatively be referred to using the term "visible region", as described throughout the present specification. As best seen in FIG. 1, the body 121 and/or the laser 103 otherwise has a smaller footprint than the carrier 101. As will be explained in more detail below, the body 121 of the laser 103 is generally configured (e.g. of a suitable shape and size) to reside in a photonic integrated circuit (PIC) cavity, supported by the carrier 101. Furthermore, as best seen in FIG. 2, the output facet 131 is located at the protruding region 133 and/or the output facet 131 is located at an end 132 of the protruding region 133.

As best seen in FIG. 1, the device 100 may further comprise, at the protruding region 133 of the laser 103 and/or the body 121, optional alignment features 135 configured to facilitate one or more of machine and human vision alignment of the output facet 131, and the corresponding waveguide 129 of the laser 103 which ends at the output facet 131, with an input facet, and respective waveguide, of a PIC to which the device 100 is being attached. As depicted, the alignment features 135 comprise two crosses, arranged symmetrically around the waveguide 129, at a face of the protruding region 133 where the waveguide 129 is located. However, the alignment features 135 when present, may comprise any suitable marks, and the like, located at any suitable position at the protruding region 133. Furthermore, while the alignment features 135 are depicted as symmetric, the alignment features 135 need not be symmetric; indeed, the alignment features 135 may be any suitable shape that is recognizable to an imaging system and/or a machine vision system, having suitable contrast therefor (e.g. compared to other portions of the protruding region 133), and where coordinates of the alignment features 135, with respect to an optical axis of the waveguide 129 and/or the output facet 131, have been predetermined and/or are "known" and/or preconfigured at a device controlling positioning of the device 100 at a PIC, as described in more detail below. The alignment features 135 may be photo-etched at the protruding region 133 during fabrication of the laser 103.

Figure 4:
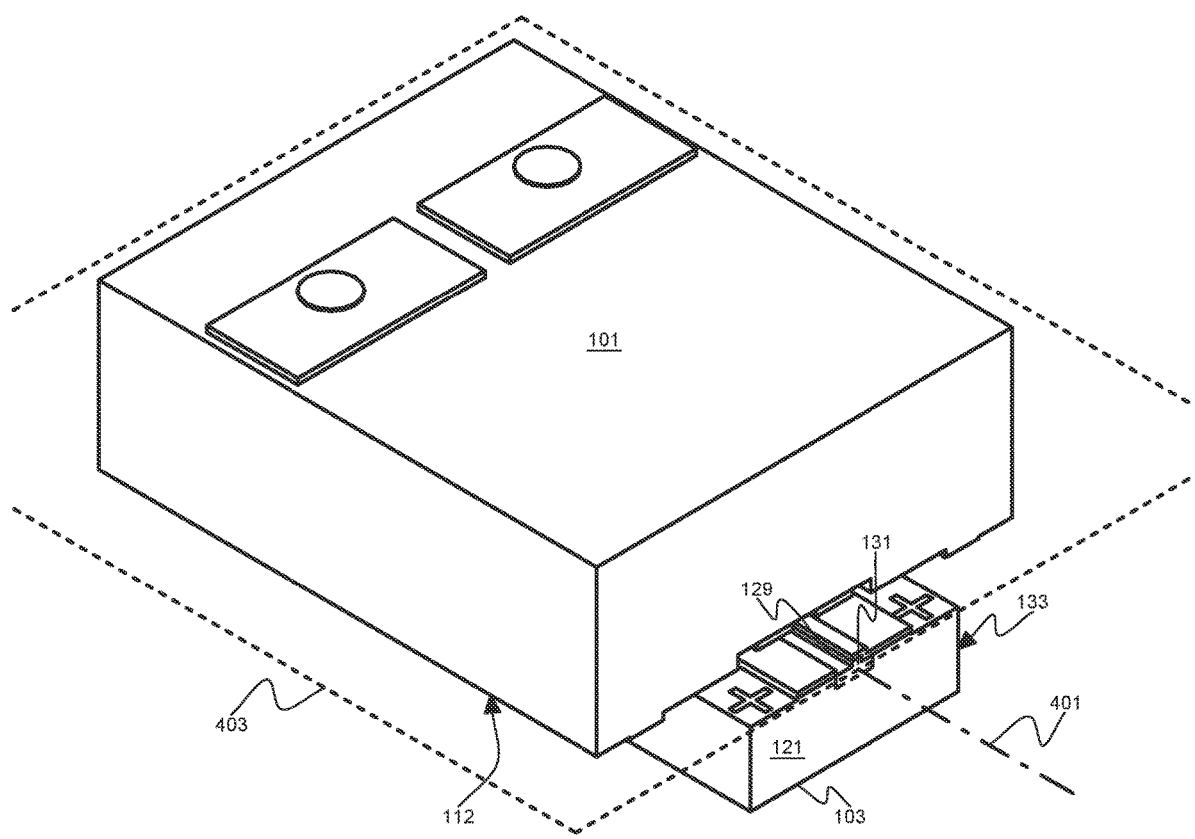
FIG. 4 depicts a perspective view of the example device of FIG. 1, in accordance with some examples.

As best seen in FIG. 2 and FIG. 3, the device 100 may further comprise, at mating surfaces (e.g. surfaces of the second side 112 and the side 125 which mate with each other) of one or more of the carrier 101 and the body 121, one or more of pedestals (e.g. as depicted pedestals 137) and recesses configured to locate the output facet 131 and a waveguide optical axis at a given plane, parallel to the second side 112. For example, attention is next directed to FIG. 4 which depicts a perspective view of the device 100, showing an end of the device 100 that includes the protruding region 133 and the output facet 131. As seen in FIG. 4, the output facet 131 includes an end of the waveguide 129, though the output facet 131 may be recessed into the body 121 of the laser 103 (e.g. light from the lasing device 123 is generally guided by the waveguide 129 formed at a surface of the body 121, though the light from the lasing device 123 may further travel in the body 121 adjacent the waveguide 129); in general, the output facet 131 comprises a portion of an end of the protruding region 133 where the waveguide 129 terminates at which light is emitted from the lasing device 123. For example, as further depicted in FIG. 4, the laser 103 further comprises a waveguide optical axis 401, which may be parallel to the waveguide 129 and/or normal (e.g. perpendicular) the output facet 131, however the waveguide optical axis 401 may be at any suitable angle to the waveguide 129 and/or the output facet 131. Indeed, the angle of the waveguide optical axis 401 may at least partially depend on the angle of the output facet 131; in some examples, an angle the waveguide optical axis 401 may be in a range of about 0° to about 21° (and/or at any suitable angle) due to refraction at the output facet 131. The waveguide optical axis 401 generally indicates a location and direction at which light is emitted from the laser 103. The output facet 131 may be perpendicular to the waveguide optical axis 401, or at another angle thereto (e.g. the aforementioned range of about 0° to about 8° and/or any other suitable angle).

As also depicted in FIG. 4, a given plane 403 is defined by the output facet 131 and the waveguide optical axis 401; for example, the given plane 403 includes the waveguide optical axis 401 and may be about perpendicular to the output facet 131 (e.g. when the output facet 131 is about perpendicular to the second side 112) and/or the given plane 403 may be about parallel to mating surfaces of the carrier 101 and/or the laser device 100. Indeed, as depicted, the given plane 403 is further parallel to the second side 112 of the carrier 101. In particular, dimensions and configurations of the one or more of the pedestals (e.g. as depicted pedestals and recesses 137) and pedestals or recesses at the mating surfaces of one or more of the carrier 101 and the body 121 are generally selected to position the given plane 403 at a location where, when the device 100 is positioned relative to a cavity of a PIC (described below), the given plane 403 is aligned with a respective plane of the PIC (e.g. which may be about perpendicular to an input facet thereof, as described in more detail below). Put another way, the pedestals 137 (and/or recesses) generally locate the waveguide optical axis 401 (e.g. and/or the output facet 131 and/or the plane 403 and/or) at a given position relative to the second side 112 of the carrier 101, as described above such that the waveguide optical axis 401 is aligned with respective an waveguide optical axis (e.g. and/or input facet) of a PIC when the device 100 is positioned relative to a cavity of a PIC (and/or respective waveguide optical axes are aligned when the device 100 is positioned relative to a cavity of a PIC).

Figure 5:
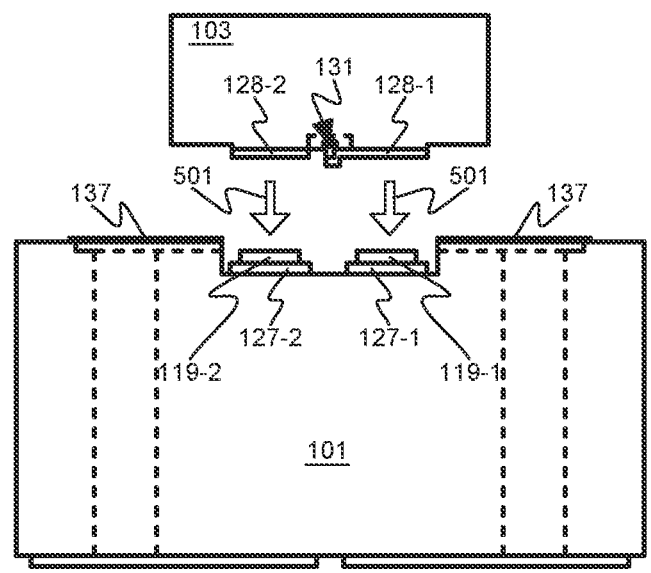
FIG. 5 depicts an end view of the laser being attached to the carrier of example device of FIG. 1, in accordance with some examples.

Attention is next directed to FIG. 5 which depicts an end view of the device 100 as the laser 103 is being attached to the carrier 101. For example, the carrier 101 and the laser 103 may be inverted as compared to FIG. 3, the carrier 101 may be placed in a rig (not depicted) and/or a device for holding the carrier 101 and the like, and the laser 103 may be mated, and electrically connected, with the carrier 101 for example by soldering the electrical contacts 127 with respective electrical connections 128 to form the solder connections 119 (e.g. the soldering represented by arrows 501); the pedestals 137 (and/or recesses) generally locate the waveguide optical axis 401 (and/or the plane 403 and/or the output facet 131) at a given position relative to the second side 112 of the carrier 101, as described above.

Figure 6:
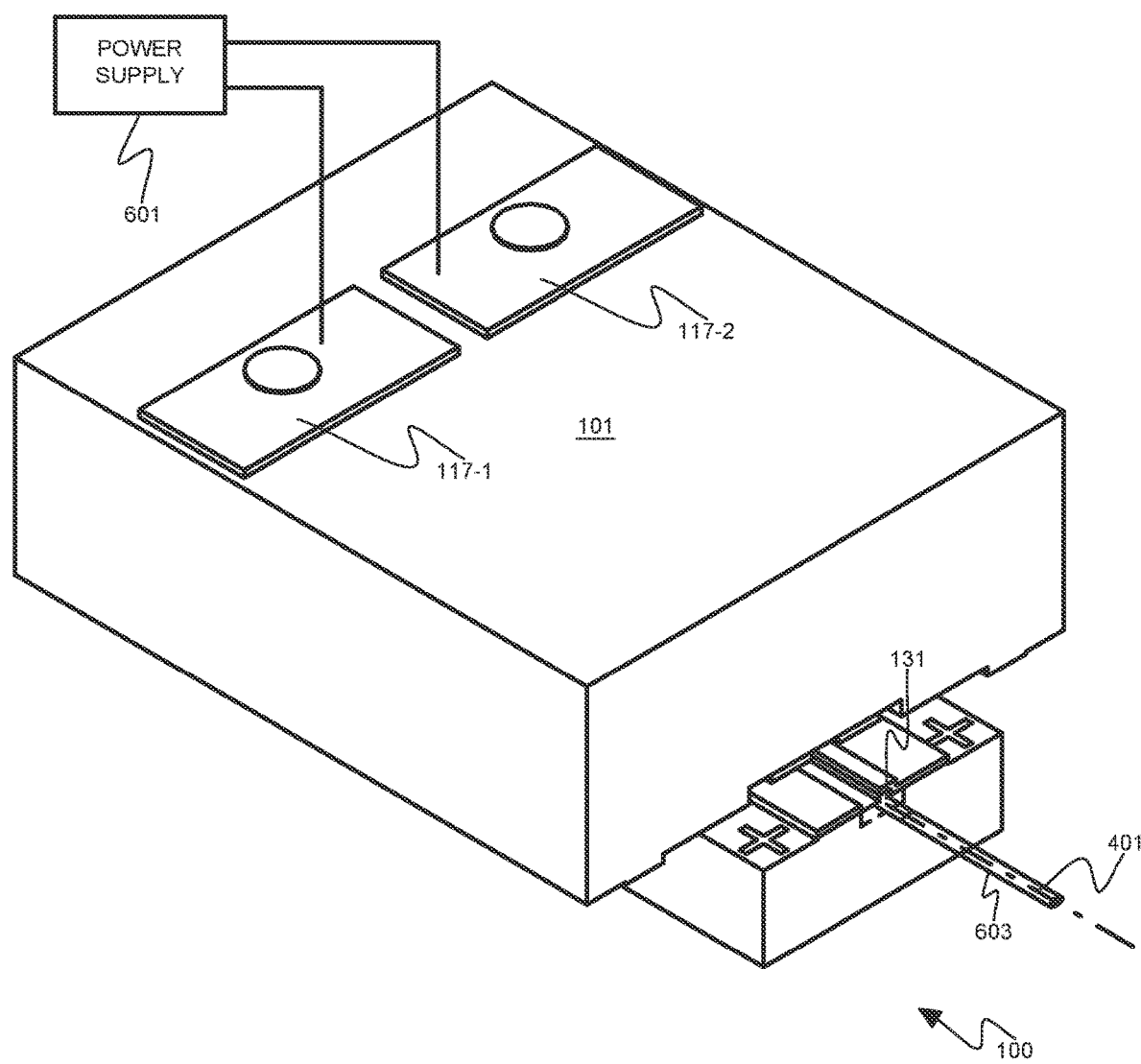
FIG. 6 depicts a perspective view of the example device of FIG. 1 being tested and/or burned-in, prior to attachment to a photonic integrated circuit, in accordance with some examples.

Once the device 100 is assembled, the device 100 may be burned-in (e.g. and tested) by operating the lasing device 123. For example attention is next directed to FIG. 6 which depicts a perspective of the device 100 being burned-in (e.g. and/or tested). For example, the electrical contacts 117 are connected to a power supply 601 and the lasing device 123 is operated such that light 603 (e.g. laser light) is emitted from the output facet 131 along the waveguide optical axis 401 and/or about along the output facet 131 (e.g. depending on an angle of the output facet 131). The burn-in (and/or testing) process may both stabilize operation of the lasing device 123 and test the operation of the lasing device 123. For example, during burn-in, the light 603 may be monitored for intensity and/or wavelength, and the like, and similarly power and/or voltage used to operate the lasing device 123 at the power supply 601 may be monitored to determine whether the lasing device 123 is operating within given parameters (e.g. compatible with a PIC and/or a telecommunication system with which the device 100 is to be used (e.g. in combination with a PIC)). The burn-in process may continue for any suitable time, which may be determined heuristically and/or until it is determined that the lasing device 123 is operating within given parameters and/or until it is determined that the lasing device 123 is not failing. Indeed, burning-in the device 100, prior to attachment to a PIC, may ensure that the device 100 is operating within the given parameters, which may increase yield of optical devices that include a combination of the device 100 and a corresponding PIC (e.g. relative to burning-in after attachment to a PIC).

Figure 7:
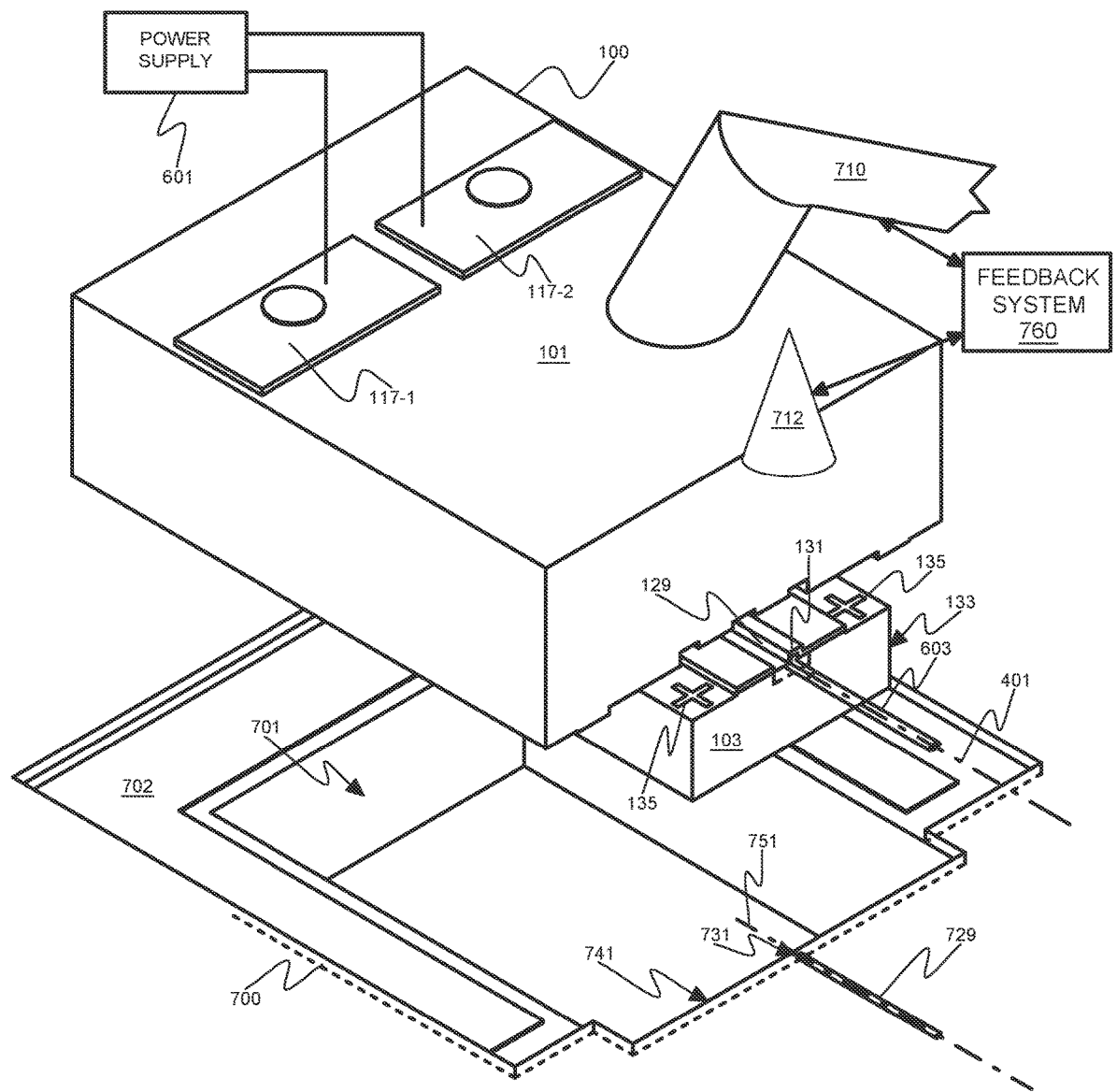
FIG. 7 depicts a perspective view of the example device of FIG. 1 being positioned relative to a cavity of an example PIC, in accordance with some examples.

Attention is next directed to FIG. 7 which depicts a perspective view of the device 100 being located at a PIC 700, which comprises a cavity 701 in a surface 702 of the PIC 700, using a robotic device 710 (e.g. a robotic arm, and the like, as depicted holding the device 100 via the carrier 101, and the like)) and an imaging system 712. The surface 702 may comprise a fixed mating surface of the PIC 700 (e.g. to which the carrier 101 is to be attached, as described in more detail below). It is understood that only a portion the PIC 700 is depicted, and that the PIC 700 further includes a waveguide 729, an input facet 731 to the waveguide 729; and the cavity 701, the input facet 731 located at an interior edge 741 of the of the cavity 701; the input facet 731 may be perpendicular to the waveguide optical axis 751 and/or at another angle thereto (e.g. similar to the output facet 131, in the aforementioned range of about 0° to about 8° and/or any other suitable angle). A waveguide optical axis 751 of the waveguide 729 and/or the input facet 731 is also depicted. It is understood that the waveguide 729, the input facet 731 and the waveguide optical axis 751 are substantially similar, respectively, to the waveguide 129, the output facet 131 and the waveguide optical axis 401, but adapted to receive light rather than output light.

While not depicted, it is understood that PIC 700 further comprises other optical components, for example which may include, but are not limited to, optical modulators, and the like, and that the waveguide 729 may be in optical communication with such optical components, such that the waveguide 729 guides light, received at the input facet 731, to such optical components, for modulation thereof, and the like.

As depicted, the device 100 is being operated via the power supply 601 during the locating, such that the light 603 is being emitted from the output facet 131, as described above. Such operation may also cause the waveguide 129 to at least partially emit light from surfaces thereof such that the waveguide 129 more visible to the imaging system 712 as compared to when the device 100 is not being operated. As another example, such operation may also cause the waveguide 129 to at least partially guide light to a photodetector and/or power detector and/or light detector, and the like, such that the output signal thereof can be used to aid in aligning the output facet 131 to the input facet 731. However, in other examples, the device 100 is not operated during the locating.

The imaging system 712 is generally positioned to image a face of the protruding region 133 where the waveguide 129 (e.g. and the output face 131) and the alignment features 135 (e.g. when present) are located and, for example, a face of the PIC 700 where the waveguide 129 and the edge 741 of the cavity 701 (e.g. and the input facet 731) are located. The imaging system 712 may comprise any suitable imaging system including, but not limited to, a machine vision system which may be in communication with a feedback system 760, that is also in communication with the robotic device 710, and/or a controller thereof. The robotic device 710 may be controlled in a feedback loop, with images from the imaging system 712 used to locate the body 121 of the laser 103 in the cavity 701 such that the carrier 101 is located at the surface 702 (and/or a pedestal and/or recess at the surface 702 of the PIC 700) and the laser 103 is located in a cavity 701 of the PIC 700, such that respective optical axes 401, 751 of the output facet 131 and the input facet 731 are about aligned. Indeed, the goal of locating the device 100 at the PIC 700 is to align the axes 401, 751 and/or the waveguides 129, 729 (and/or the facets 131, 731) such that light exiting the output facet 131 enters the input facet 731. While not depicted, the surface 702 may also include pedestals and/or recesses onto which (and/or into which) the carrier 101 is located and/or which mate with respective features at the carrier 101.

In some examples, the alignment of the optical axes 401, 751, etc., may be detected via the imaging system 712 imaging the protruding region 133 during attachment of the carrier 101 attached to the surface 702 (e.g. via a polymer adhesive and/or a thermoset adhesive and/or an ultraviolet (UV) adhesive and the like.

However, in other examples, prior to attaching the carrier 101 to the surface 702, the robotic device 710 may be used to move the device 100 to more precisely align the respective optical axes 401, 751, and the like, using the feedback system 760 which is generally configured to assist with determining when the optical axes 401, 751 and the like, are aligned. For example, the imaging system 712 (e.g. machine vision system) may be used to image one or more of the protruding region 133 and the alignment features 135 relative to the waveguide 729 of the PIC 700, during the moving of the laser device 100 to determine when the optical axes 401, 751 and the like are more precisely aligned. For example, the feedback system 760, which may comprise any suitable combination of processers, controllers, memories, and the like, may be configured to determine a position of the alignment features 135 relative to features of the PIC 700 that correspond to the optical axes 401, 751 and the like being more precisely aligned. In particular, as coordinates of the alignment features 135, with respect to the optical axis 401 and/or the output facet 131, have been predetermined and/or are "known", and may be preconfigured at the feedback system 760, and the like, the feedback system 760 may rely on images of the alignment features 135 to position and/or locate the device 100 relative to the PIC 700.

Furthermore, the more precise alignment may also occur during operation of the laser device 100 such that, when the optical axes 401, 751, and the like, being more precisely aligned, the waveguide 729 may become more visible to the imaging system 712 due to the light 603 entering the waveguide 729 more precisely.

In yet another example, the feedback system 760 may further comprise one or more of a power measurement device and a light measurement device (not depicted) in optical communication with the input facet 731 via the waveguide 729, for example via an optical tap, and the like, located at the waveguide. During the more precise alignment of the optical axes 401, 751 and the like, output of the power measurement device and/or the light measurement device (e.g. a photo detector) is monitored by the feedback system 760 as the robotic device 710 moves the device 100. The feedback system 760 may determine that the optical axes 401, 751 and the like are more precisely aligned by determining that an output signal of the power measurement device and/or the light measurement device is about maximized at a given location of the laser device 100 relative to the PIC 700 (e.g. and enablement of such maximizing by the present specification may be an advantage over soldering during alignment). In some examples, more precise positioning may be facilitated with an index matching polymer fluid placed between the output fact 131 and input facet 731 (e.g. to facilitate transfer of light therebetween).

Put another way, in a first step, the device 100 is positioned at the surface 702 with the laser 103 located in the cavity 701, and the facets 131, 731 about facing each other and/or facing in opposite directions, but without initial regard to precision of the alignment of the optical axes 401, 751 and the like; in a second step, the device 100 is more further positioned to more precisely align the optical axes 401, 751 and the like. Put yet another way, physical mating surfaces of the PIC 700 and the device 100 are not necessarily used to align the optical axes 401, 751 but rather the optical axes 401, 751 may be aligned in the second step.

Furthermore, in some examples, as will be described in more detail below, while the physical mating surfaces of the PIC 700 and the device 100 may be used to initially position the device 100 at the surface 702, the robotic device 710, and the like, may be used to locate the device 100 relative to the PIC 700 (e.g. whether the carrier 101 is touching the surface 702, or not) and polymer adhesive, and the like, may be used to fix the device 100 in place relative to the PIC 700 (e.g. with respective mating surfaces being separated). Such "vertical" positioning may be performed in a manner that aligns the optical axes 401, 751, and the like, and/or maximizes light from the output facet 131 into the input facet 731, and/or maximized light detected by a power and/or light measurement device, as described above.

Figure 8:
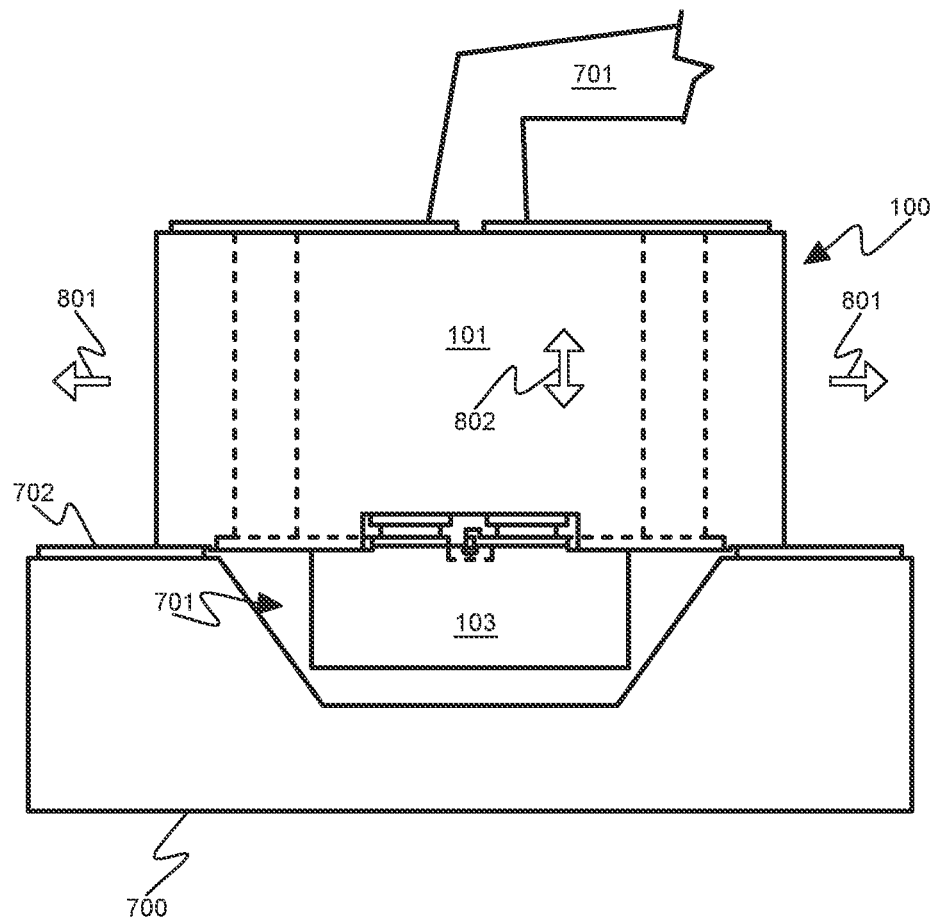
FIG. 8 depicts an end view of the example device of FIG. 1 being more precisely aligned at the PIC, in accordance with some examples.

For example, attention is next directed to FIG. 8 which depicts an end view of the device 100 (e.g. similar to the view of FIG. 5, but with the device 100 flipped), and with the laser 103 located in the cavity 701 of the PIC 700 (which is depicted schematically without the waveguide 729, etc.); in other words, in FIG. 8 a first step, of positioning the device 100 at the surface 702, with the laser 103 located in the cavity 701, and the facets 131, 731 about facing each other, but without initial regard to precision of the alignment of the optical axes 401, 751 and/or the facets 131, 731, has occurred. As depicted, the robotic device 710 may then move the device 100 side-to-side relative to the surface 702 and/or the cavity 701, as represented by the arrows 801, until the more precise alignment is achieved, as described above. Similarly, the robotic device 710 may move the device 100 vertically relative to the surface 702 and/or the cavity 701 (e.g. towards and away from the surface 702 and/or the cavity 701), as represented by the double-ended arrow 802.

Figure 9:
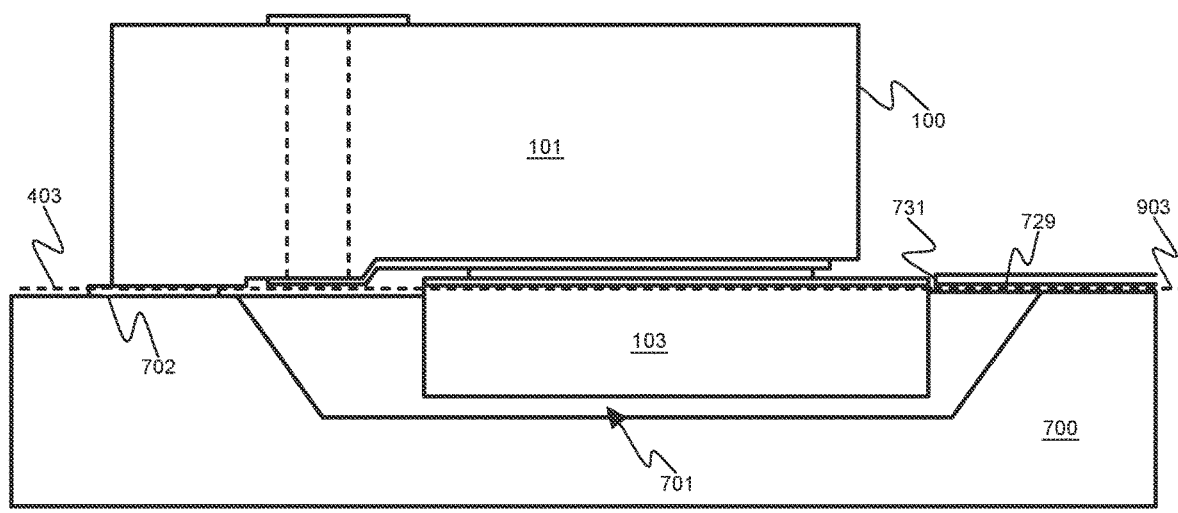
FIG. 9 depicts a side view of the example device of FIG. 1 attached to the PIC with respective planes, optical axes, waveguides and facets aligned, in accordance with some examples.
Figure 10:
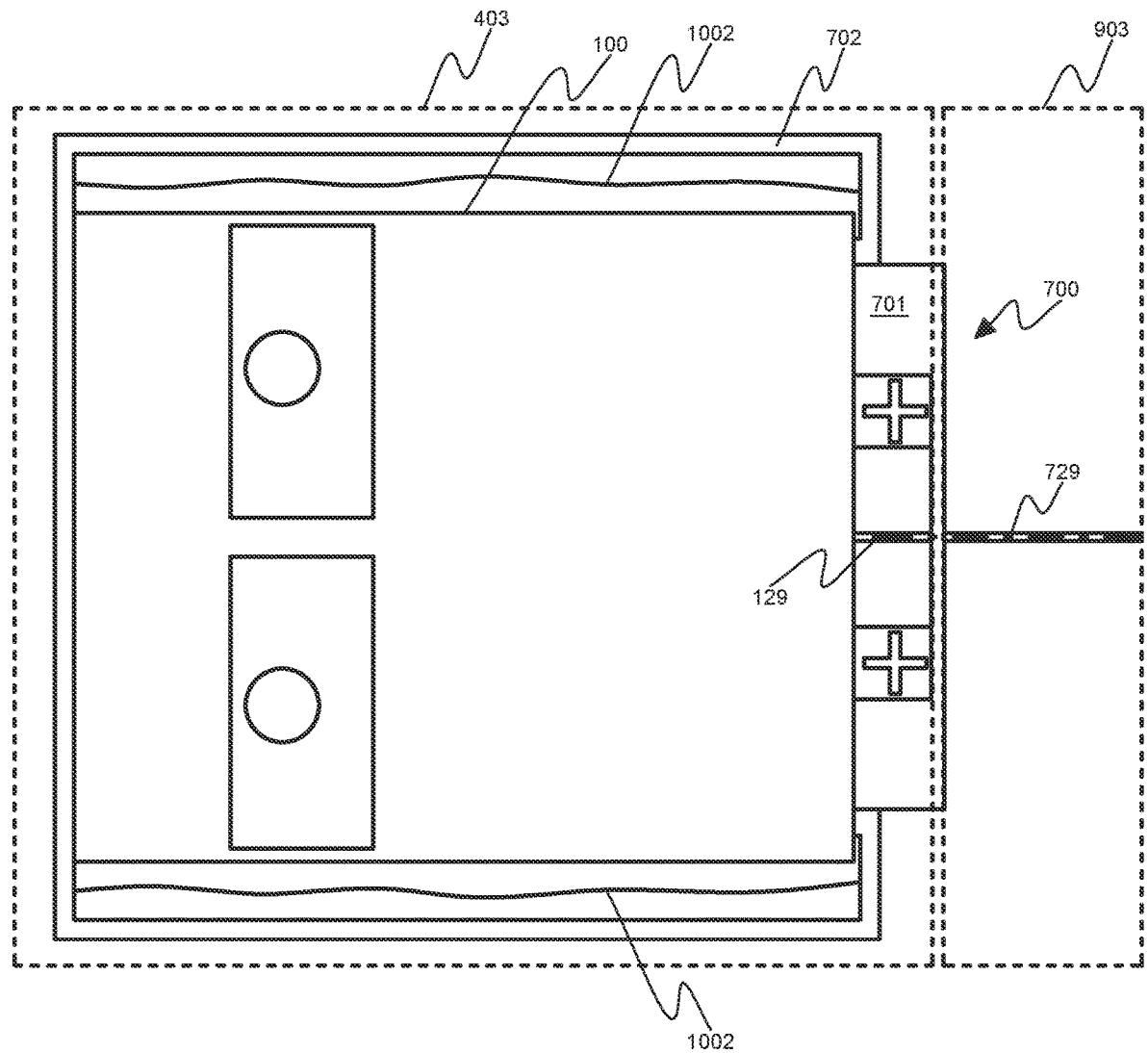
FIG. 10 depicts a top view of the example device of FIG. 1 attached to the PIC with respective planes, optical axes, waveguides and facets aligned, in accordance with some examples.

Such precise alignment is further depicted in FIG. 9 and FIG. 10 which respectively depict a schematic side view of the device 100 and the PIC 700 and a top view of the device 100 and the PIC 700. The view in FIG. 9 is similar to the view in FIG. 2, however some components of the device 100 and the PIC 700 are omitted for simplicity and visual clarity, but they are nonetheless understood to be present.

In particular, in FIG. 9 depicts the device 100 with the carrier 101 located at the surface 702 (and/or a mating reference surface which may or may not be the same as the surface 702) of the PIC 700 and the laser 103 located in the cavity 701. The PIC 700 is depicted in cross-section to show the relative locations of the carrier 101 and the laser 103 relative to the surface 702 and the cavity 701 (e.g. the PIC 700 is depicted through a plane perpendicular to the surface 702). Also depicted in FIG. 9 and FIG. 10 is a plane 903 of the PIC 700 which includes the waveguide optical axis 751 of the waveguide 729 and which is about perpendicular to the input facet 731; the plane 903 is depicted in a side view in FIG. 9 and in a top view in FIG. 10. The plane 403 of the device 100 is also depicted in a side view in FIG. 9 and in a top view in FIG. 10. Comparing FIG. 9 and FIG. 10 with FIG. 7, it is understood that the plane 903 is aligned with the plane 403 of the device, that includes the respective waveguide optical axis 401 of the respective waveguide 129 and is about perpendicular to the output facet 131. Hence, the more of pedestals and recesses of the device 100, described heretofore with reference to the pedestals 137, are generally selected to be of a size and configuration to locate the output facet 131 and the waveguide optical axis 401 at the plane 403 that aligns with the plane 903 when the carrier 101 is attached to the PIC 700. In particular, the term "align" and/or "precisely align" as used with respect to the planes 403, 903 may be understood to mean that the planes 403, 903 are positioned in a same plane and/or coplanar with one another. Put another way, as previously described, the one or more of the pedestals and the recesses (e.g. the pedestals 137) are configured locate the output facet 131 and the waveguide optical axis 401 at the plane 403, relative to a surface (e.g. at the second side 112) of the carrier 101 that is attached to the PIC 700.

Reference is next made to FIG. 10 which further shows that the waveguides 129, 729 are also aligned when the planes 403, 903 are aligned. In particular, the term "precisely align" as used with respect to the waveguides 129, 729 may be understood to mean that the waveguides 129, 729 are positioned in a same line and/or colinear with one another. However, the term "align" as used with respect to the waveguides 129, 729 may be understood to mean that the waveguides 129, 729 are positioned about parallel to each other with the facets 131, 731 facing in opposite directions (e.g. when the facets 131, 731 are perpendicular to respective axes 401, 751; in some examples, the term "align" as used with respect to the waveguides 129, 729 may be further understood to mean that the waveguides 129, 729 are positioned about parallel to each other with the facets 131, 731 positioned such that a portion of light emitted from the output facet 131 enters the input facet 731 (e.g. but which may not be maximized).

Indeed, the planes 403, 903 may comprise optical planes which are referenced to and/or correlative with datum reference planes and/or semiconductor-based (e.g. as they may be formed and/or references to semiconductor surfaces of the device 100 and the PIC 700) datum reference planes, at both the laser assembly device 100 and the PIC 700; such datum reference planes may be located at mating surfaces of the laser assembly device 100 such that, when aligned, the respective planes 403, 903 align. Put another way, the planes 403, 903 may comprise vertical optical planes correlated to semiconductor-based datum reference planes at both the PIC 700 and laser assembly 100; when the laser assembly 100 is flipped and brought into contact with the PIC 700, these physical datum reference planes mate, which may result in the optical planes 403, 903 being aligned. Such a technique that may reduce machine assisted alignment requirements.

While not depicted in FIG. 10, it is understood that the facets 131, 731 are also aligned when the planes 403, 903 are aligned. In particular, the term "precisely align" as used with respect to the facets 131, 731 may be understood to mean that the facets 131, 731 are positioned to maximize light emitted from the output facet 131 into the input facet 731. However, the term "align" as used with respect to the facets 131, 731 may be understood to mean that the facets 131, 731 are positioned such that a portion of light emitted from the output facet 131 enters the input facet 731 (e.g. but which may not be maximized). Put another way, in some examples, when the facets 131, 731 are precisely aligned, more light may enter the input facet 731 from the output facet 131 as compared to when facets 131, 731 are initially aligned. However, the initial alignment may result in the facets 131, 731 (and/or the waveguides 129, 729) being precisely aligned.

As will be explained below, in FIG. 10 the carrier 101 has been attached to the surface 702 of the PIC 700 using an adhesive 1002, and the like, for example along two sides of the carrier 101 adjacent the surface 702. However, the adhesive 1002 may be located at any suitable location that attaches the carrier 101 to the surface 702 of the PIC 700.

The adhesive 1002 may comprise any suitable polymer adhesive compatible with the device 100 and the PIC 700 and further compatible with an environment in which the combination of the device 100 and the PIC 700 are to be deployed (e.g. in a telecommunications system, and the like). For example, the adhesive 1002 may comprise comprises an ultra-violet (UV) adhesive a thermoset adhesive, and the like, however any suitable adhesive and/or polymer adhesive is within the scope of the present specification. In some examples, soldering may be used to attach the carrier 101 to the surface 702 of the PIC 700.

While not depicted, the adhesive 1002 may be dispensed automatically using in response to the feedback system 760 determining that the device 100 and the PIC 700 are aligned and/or more precisely aligned, as described herein, for example using any suitable adhesive dispensing system which may be controlled by the feedback system 760, and the like. Indeed, the use of the adhesive 1002 obviates soldering of the device 100 to the PIC 700 which may reduce damage and/or increase yield (e.g. relative to when soldering is used), however the present specification does not exclude use of solder to attach the device 100 to the PIC 700 (e.g. solder may be used to attach the carrier 101 to the surface 702 of the PIC 700.

However, in further examples, rather than more precisely align the optical axes 401, 751 and/or the facets 131, 731, the facets 131, 731 may be optically connected using polymer waveguide and/or a three-dimensional (3D) printed polymer waveguide, and the like. For example, attention is next directed to FIG. 11 which depicts an alternative example in which the planes 403, 903 are aligned, however the optical axes 401, 751 and/or the facets 131, 731 and/or the waveguides 129, 729 are only about aligned in that the waveguides 129, 729 are not colinear, and the facets 131, 731 are not arranged to maximize light emitted from the output facet 131 into the input facet 731. However, a polymer waveguide 1101 (e.g. a 3D printed polymer waveguide) has been used to optically connect the output facet 131 and the input facet 731 such that light emitted from the output facet 131 is conveyed to the input facet 731 via the polymer waveguide 1101. However, any suitable optical coupling device may be used to couple the facets 131, 731 including, but not limited to, evanescent waveguides, tapered waveguides, and/or any other suitable waveguide, and the like.

Figure 11:
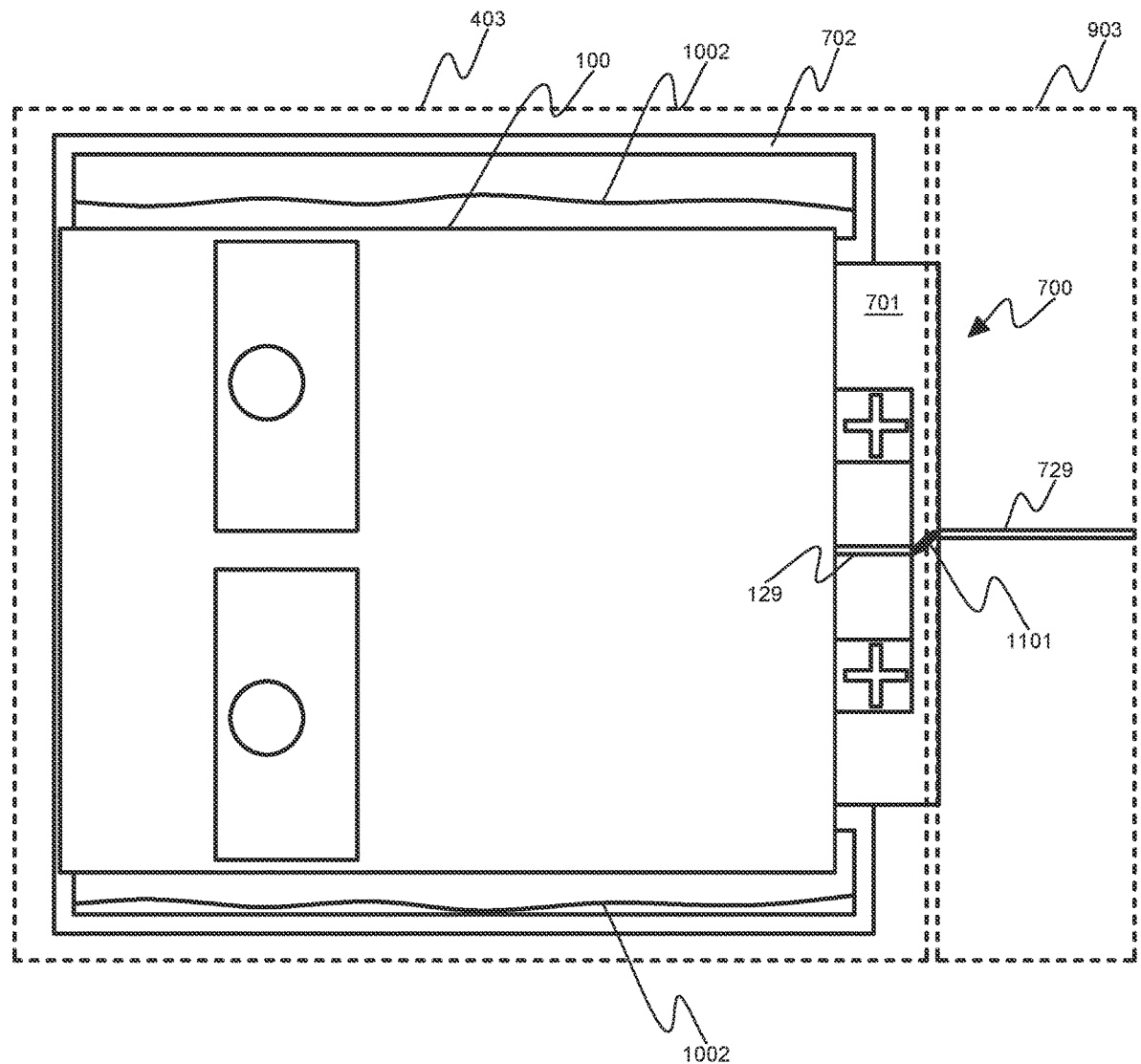
FIG. 11 depicts a top view of the example device of FIG. 1 attached to the PIC in an alternative manner that uses a polymer waveguides, in accordance with some examples.

Hence, in general, the combination of the device 100 and the PIC 700 may form an optical device which may be used with a telecommunication system, and the like. Such an optical device generally comprises: a photonic integrated circuit (PIC) 700 including a waveguide 729, an input facet 731 (e.g. an input portion) to the waveguide 729; and a cavity 701, the input facet 731 located at an interior edge 741 of the of the cavity 701; and a laser device 100 comprising: a carrier 101 comprising: opposing sides 111, 112 joined by an edge 113; through-carrier-vias (TCVs) 115 between the opposing sides 111, 112, the TCVs 115 including electrical contacts 117 therethrough; and a laser 103 attached to a given side 112 of the opposing sides 111, 112 of the carrier 101, the laser 103 comprising: a body 121 supporting components of the laser 103; a lasing device 123 configured to produce light 603 for the PIC 700, the lasing device 123 located between the given side 112 of the carrier 101 and the body 121; respective electrical connections 127 from the lasing device 123 to the electrical contacts 117 of the TCVs 115; and an output facet 131 (e.g. an output portion) and respective waveguide 129 configured to convey the light 603 from the lasing device 123 out of the laser 103, a protruding region 133 of the body 121, supporting the output facet, 131 and the respective waveguide 129, protruding the edge of the carrier 101, the body 121 otherwise having a smaller footprint than the carrier 101, the body 121 located in the cavity 701 of the PIC 700 with the output facet 131 and the respective waveguide 129 respectively aligned with the input facet 731 and the waveguide 729 of the PIC 700, the carrier 101 attached to the PIC 700, the carrier 101 supporting the body 121 in the cavity 701. Examples of the optical device that includes the laser device 100 and the PIC 700 are shown in FIG. 9, FIG. 10 and FIG. 11.

It is further understood that electrical connections to the assembly 100 can be made to the electrical contacts 117 using one or more of bonded wire, conductive adhesive, contact pins, solder, and the like, for example to electrically connect the assembly 100 to the PIC 700 and/or another device which operates the laser 103 during operation of an optical device into which the assembly 100 and the PIC 700 are incorporated.

As has already been explained, in such an optical device, a first plane 903 of the PIC 700, that includes a waveguide optical axis 751 of the waveguide 729 and may be about perpendicular to the input facet 731, may be aligned with a second plane 403 of the body 121, that includes a respective waveguide optical axis 401 of the respective waveguide 129 and is about perpendicular to the output facet 131.

Similarly, in such an optical device, a first plane 903 of the PIC 700 may include a waveguide optical axis 751 of the waveguide 729, and may be about perpendicular to the input facet 731, and the optical device may further comprise, at one or more of the given side 112 of the carrier 101, and a respective side 125 of the body 121 attached to the given side 112, one or more of pedestals (e.g. pedestals 137) and recesses, configured to locate the waveguide optical axis 401 at a second plane 403 that aligns with the first plane 903 when the carrier 101 is attached to the PIC 700, the second plane 403 being about perpendicular to the output facet 131. Similarly, in such an optical device, one or more of the pedestals and the recesses may locate the output facet 131 and the waveguide optical axis 401 at the second plane 403 relative to a surface (e.g. at the side 112) of the carrier 101 that is attached to the PIC 700.

While the examples heretofore have been described with respect to the waveguide 129 and the output facet 131 being located at the protruding region 133, in other examples a combination of a laser and a carrier may include a region (e.g. a visible region) which is visible to an external vision system and that includes an output facet of the laser, as well as a portion of a waveguide from a lasing device of the laser to the output facet, and allows the laser to be more easily positioned at a surface of a PIC. For example, heretofore, such a visible region includes the protruding region 133, however such a visible region may alternatively be achieved by "flipping" the laser 103 relative to carrier 101 (e.g. as described in more detail below with respect to FIG. 13). A method for assembling a device that includes a carrier and a laser with a visible region, with a PIC is next described using the device 100 and the PIC 700 as an example.

Figure 12:
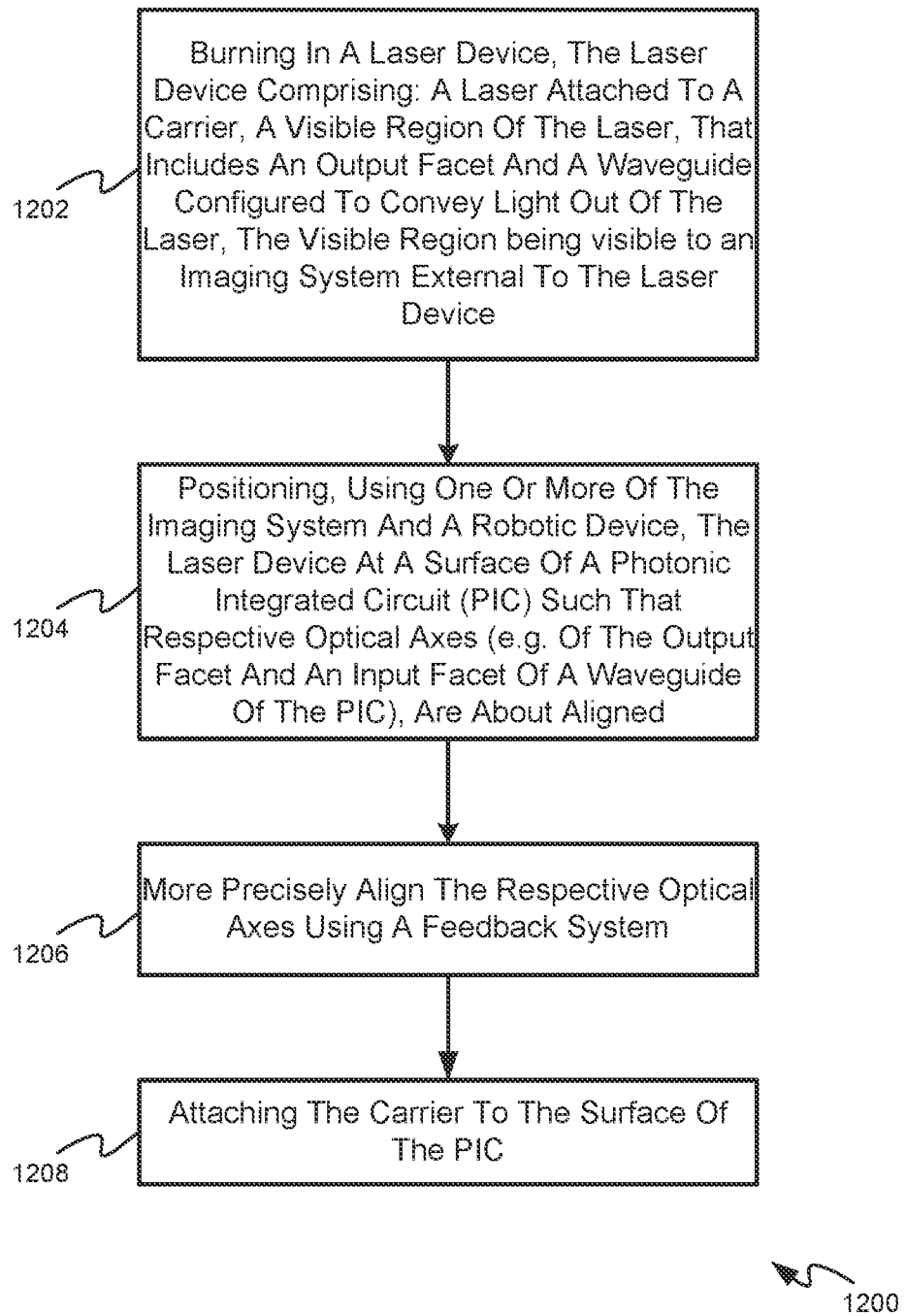
FIG. 12 depicts a flowchart of a method for attaching the example device of FIG. 1 to a PIC, in accordance with some examples.

Hence, attention is next directed to FIG. 12 which depicts an example method 1200 of manufacture of an optical device which may be performed by the components described herein. However, the method 1200 may be performed by other suitable components.

At a block 1202, the laser device 100 is burned-in. As has already been explained, the laser device 100 comprises: a laser 103 attached to a carrier 101, a visible region (e.g. the protruding region 133) of the laser 103 that includes an output facet 131 and at least a portion of a waveguide 129 configured to convey light out of the laser 103, the visible region being visible to an imaging system (e.g. the imaging system 712) external to the laser device 100. The burning-in may occur via the power supply 601 and may be performed by placing the laser device 100 in a burn-in rig, and the like, that includes connections to the power supply 601 that connect to the electrical contacts 117; the burning-in may comprise monitoring the laser 103 (e.g. light emitted therefrom) and/or the burning—in may comprise operating the laser 103 via the power supply 601 according to a predetermined protocol to test for failure and/or life, and the like.

At a block 1204, the laser device 100 is positioned at a surface 702 of the PIC 700, using an imaging system 712 and/or a robotic device 710 such that respective optical axes 401, 751 (e.g. of the output facet 131 and an input facet 731 of a waveguide 729 of the PIC 700), are about aligned. In specific examples, the laser device 100 may be positioned at a surface 702 of the PIC 700 such that the carrier 101 is located at the surface 702 and the laser 103 is located in a cavity 701 of the PIC 700, as described above, such that such that respective optical axes 401, 751 are about aligned.

At an optional block 1206, the laser device 100 may be further positioned to more precisely align the respective optical axes 401, 751 (e.g. of the output facet 131 and the input facet 731) using the feedback system 760, as well as using the imaging system 712 and/or the robotic device 710.

At a block 1208, the carrier 101 is attached to the surface 702 of the PIC 700. For example, the carrier 101 may be attached to the surface 702 of the PIC 700 using the adhesive 1002, a polymer adhesive, a UV adhesive, a thermoset adhesive, and the like. When a UV adhesive is used, the block 1208 may include curing the UV adhesive using UV light. Similarly, when a thermoset adhesive is used, the block 1208 may include curing the thermoset adhesive using heat. In some examples, the block 1208 may include attaching carrier 101 to the surface 702 of the PIC 700 using solder.

In general, the method 1200 may be performed in an automated manner.

In particular, when the block 1206 is implemented, prior to attaching the carrier 101 to the surface 702 of the PIC 700, at the block 1208, the method 1200 may further comprise: more precisely align the respective optical axes 401, 751 of the output facet 131 and the input facet 731 using the feedback system 760 configured to assist with determining when the output facet 131 and the input facet 731 are aligned; and in response to determining, using the feedback system 760, that the output facet 131 and the input facet 731 are more precisely aligned, attaching (e.g. at the block 1208) the carrier 101 to the surface 702 of the PIC 700 using the polymer adhesive 1002. For example, the feedback system 760 may determine that the output facet 131 and the input facet 731 are more precisely aligned when the waveguides 129, 729 are co-linear, and the like based on images from the imaging system 712.

As previously described, the feedback system 760 may include the imaging system 712, and/or the feedback system 760 may be in communication with the imaging system 712. Furthermore, as also previously described, the imaging system 712 may comprise a machine vision system positioned to image one or more of the visible region (e.g. the protruding region 133) and the alignment features 135 on the visible region (e.g. the protruding region 133), relative to the waveguide 729 of the PIC 700. In some examples, the method 1200 may further comprise: imaging, using the machine vision system, one or more of the visible region (e.g. the protruding region 133) and the alignment features 135 relative to the waveguide 729 of the PIC 700, during the moving of the laser device 103 (e.g. at the block 1206) to determine when the output facet 131 and the input facet 731 are more precisely aligned. For example, the feedback system 760 and/or the imaging system 712 may be configured to determine that when the alignment features 135 and/or the waveguide 129 are located a given position relative to the waveguide 729, the facets 131, 731 are aligned and/or more precisely aligned.

In some examples, the method 1200 may further comprise operating the laser device 100, during the moving of the laser device 100 (e.g. at the block 1204 and/or the block 1206) to assist the machine vision system and/or the imaging system 712 with imaging one or more of the visible region (e.g. the protruding region 133) and the alignment features 135 relative to the waveguide 729 of the PIC. In particular, operating the laser device 100, during the moving of the laser device 100 may assist the machine vision system and/or the imaging system 712 with determining when the light 603 exiting the output facet 131 is entering the input facet 731 (e.g. due to a reduction in light scattering and the like, and or via the waveguide 729 emitting a portion of the light 603 travelling through the waveguide 729).

As has already been described, in some examples, the visible region (e.g. the protruding region 133) includes the alignment features 135. In some of these examples, the method 1200 may further comprise: imaging, using the imaging system 712, the alignment features 135 to assist with one or more of: positioning (e.g. at the block 1204), using the imaging system 712 and/or the robotic device 710, the laser device 100 at the surface of the PIC 700; and moving (e.g. at the block 1206), using the imaging system 712 and/or the robotic device 710, the laser device 100 to more precisely align the output facet 131 with the input facet 731. Again, the feedback system 760 and/or the imaging system 712 may be configured to determine that when the alignment features 135 and/or waveguide 129 are located a given position relative to the waveguide 729, the facets 131, 731 are aligned and/or more precisely aligned.

As has already been described, in some examples, the feedback system 760 may comprise one or more of a power measurement device and a light measurement device in optical communication with the input facet 731 via the waveguide 729; in these examples, the method 1200 may further comprise determining, using the feedback system 760, that the respective optical axes 401, 751 are more precisely aligned: determining that an output signal of one or more of the power measurement device and the light measurement device is about maximized at a given location of the laser device relative to the PIC.

In other examples, however, the block 1206 may be omitted and the method 1200 may further comprise using a polymer waveguide 1101 to optically connect the output facet 131 to the input facet 731. In such examples, any suitable device and/or material may be used to form the polymer waveguide 1101.

In some examples, polymer waveguides (and/or 3D-printed polymer waveguides) may be used in combination with attaching laser devices to a PIC in other configurations that may not include a cavity. For example, attention is next directed to FIG. 13 which schematically depicts a laser device 1300 (and/or a laser assembly 1300, and the like) comprising a carrier 1301 and a laser 1303 attached thereto; however, in contrast to the carrier 101 and the laser 103, the laser 1303 is attached to the carrier 1301 with a lasing device 1323, as well as a waveguide 1329 and a respective output facet 1331 (e.g. an output portion), at a side opposite the carrier 1301. However, in other examples, the laser device 1300 may be similar to, and/or the same as, the laser device 100. While details of the carrier 1301 and the laser 1303 are not depicted, it is understood that the laser 1303 includes a lasing device similar to the lasing device 123, and the like.

Figure 13:
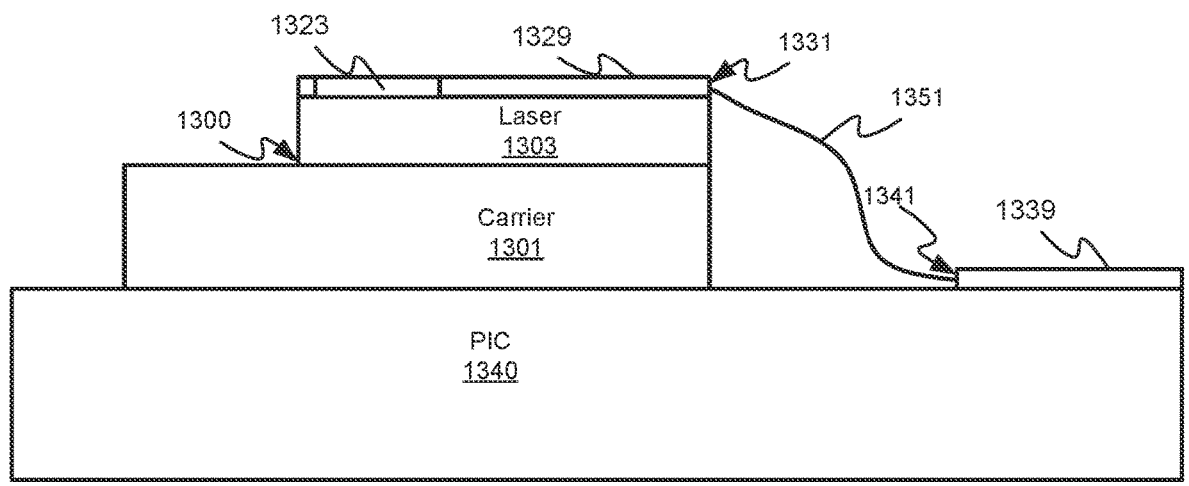
FIG. 13 depicts an alternative device that includes a carrier and a laser attached to an alternative PIC with a polymer waveguide used to optically connect facets thereof, in accordance with some examples Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

As also depicted in FIG. 13, the device 1300 is attached to a surface of a PIC 1340, for example using an adhesive, and the like, at a side of the carrier 1301 opposite that of the laser 1303. In contrast to the device 100 and the PIC 700, the laser 1303 is not located in a cavity of the PIC 1340; indeed, as depicted, the PIC 1340 does not include a cavity similar to the cavity 701.

Furthermore, the side of the laser 1303 that includes the waveguide 1329 and a respective output facet 1331 may comprise a visible region, which may be used to position and/or align the device 1300 at the PIC 1340, as described above with respect to the method 1200. The visible region may include alignment features, similar to the alignment features 135, as described above.

In particular, the laser 1303 may be burned-in prior to attachment to the PIC 1340 as described above. As depicted, the PIC 1340 comprises a waveguide 1339 and a corresponding input facet 1341 (e.g. an input portion), which may be respectively similar to the waveguide 729 and the input facet 731, however the waveguide 1339 and the input facet 1341 are not located at a cavity.

As depicted, the facets 1331, 1341 are facing in opposite directions, but are not otherwise aligned; furthermore, the facets 1331, 1341 may be at any suitable angle, similar as described above with respect to the facets 131, 731. As depicted, the facets 1331, 1341 are in optical communication via a polymer waveguide 1351 (e.g. a 3D printed polymer waveguide), such that light exiting the output facet 1331 is conveyed to the input facet 1341 via the polymer waveguide 1351. However, any suitable optical coupling device may be used to couple the facets 1331, 1341 including, but not limited to, evanescent waveguides, tapered waveguides, and/or any other suitable waveguide, and the like.

In some examples, during attachment of the device 1300 to the PIC 1340, the device 1300 may be located at the PIC 1340 to minimize and/or reduce a distance between the facets 1331, 1341 to minimize and/or reduce a length of the polymer waveguide 1351.

Hence, in these examples, the device 1300 may be fabricated and/or burned-in (and/or screened by testing and/or tested) prior to attachment to the PIC 1340, attached to the PIC 1340 and the polymer waveguide 1351 may be attached between the facets 1331, 1341 to optically connect the facets 1331, 1341. Furthermore, in some examples, the device 1300 may include alignment features (e.g. similar to the alignment features 135 and adjacent the waveguide 1329 at a surface visible to an imaging system) to assist with positioning device 1300 at the PIC 1340. Furthermore, while not depicted, it is further understood that electrical connections to the assembly 1300 can be made to the electrical contacts (e.g. similar to the electrical contacts 117) using one or more of bonded wire, conductive adhesive, contact pins, solder, and the like, for example to electrically connect the assembly 700 to the PIC 1340 and/or another device which operates the laser 1323 during operation of an optical device into which the assembly 1300 and the PIC 1340 are incorporated.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

The terms "about", "substantially", "essentially", "approximately", and the like, are defined as being "close to", for example as understood by persons of skill in the art. In some examples, the terms are understood to be "within 10%," in other examples, "within 5%", in yet further examples, "within 1%", and in yet further examples "within 0.5%".

Persons skilled in the art will appreciate that in some examples, the functionality of devices and/or methods and/or processes described herein can be implemented using pre-programmed hardware or firmware elements (e.g., application specific integrated circuits (ASICs), electrically erasable programmable read-only memories (EEPROMs), etc.), or other related components. In other examples, the functionality of the devices and/or methods and/or processes described herein can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

Persons skilled in the art will appreciate that there are yet more alternative examples and modifications possible, and that the above examples are only illustrations of one or more embodiments. The scope, therefore, is only to be limited by the claims appended hereto.

What is claimed is:

1. A device comprising:
    a photonic integrated circuit (PIC) including a waveguide, an input portion to the waveguide; and a cavity, the input portion located at an interior edge of the cavity; and
    a laser device comprising:
        a carrier comprising:
            a first side, a second side opposing the first side, and an edge joining the first side and the second side; through-carrier vias (TCVs) from the first side to the second side, the TCVs including electrical connections therethrough; first electrical contacts for the electrical connections at the first side; and second electrical contacts for the electrical connections at the second side; and
        a laser attached to the second side of the carrier, the laser comprising:
            a body supporting components of the laser; a lasing device configured to produce light, the lasing device located at a respective side of the body attached to the second side of the carrier;
            respective electrical connections from the second electrical contacts to the lasing device; and
            a protruding region of the body protruding the edge of the carrier, the body otherwise having a smaller footprint than the carrier; and
            an output portion and a respective waveguide configured to convey light from the lasing device out of the laser, the output portion located at the protruding region of the body,
        the body located in the cavity of the PIC, with the output portion and the respective waveguide respectively aligned with the input portion and the waveguide of the PIC, the carrier attached to the PIC, the carrier supporting the body in the cavity,
        wherein the protruding region is located in the cavity, and the protruding region comprises a visible region that includes the output portion, the visible region being visible in the cavity adjacent the input portion of the PIC.

2. The device of claim 1, further comprising, at mating surfaces of one or more of the second side of the carrier and the body, one or more of pedestals and recesses configured to locate the output portion and a waveguide optical axis at a given plane, parallel to the second side.

3. The device of claim 1, further comprising, at the protruding region, alignment features configured to facilitate one or more of machine and human vision alignment of the output portion, and the respective waveguide of the laser which ends at the output portion, with the input portion, and the waveguide of the PIC.

4. The device of claim 1, wherein the carrier further comprises a recess at the second side, the second electrical contacts located at least partially in the recess at the second side.

5. A device comprising:
    a photonic integrated circuit (PIC) including a waveguide, an input portion to the waveguide; and a cavity, the input portion located at an interior edge of the of the cavity; and
    a laser device comprising:
        a carrier comprising: opposing sides joined by an edge; through-carrier-vias (TCVs) between the opposing sides, the TCVs including electrical connections therethrough; and
        a laser attached to a given side of the opposing sides of the carrier, the laser comprising: a body supporting components of the laser; a lasing device configured to produce light for the PIC, the lasing device located between the given side of the carrier and the body; respective electrical connections from the lasing device to the electrical connections of the TCVs; and an output portion and respective waveguide configured to convey the light from the lasing device out of the laser, a protruding region of the body, supporting the output portion, and the respective waveguide, protruding the edge of the carrier, the body otherwise having a smaller footprint than the carrier, the output portion located at the protruding region of the body, the body located in the cavity of the PIC with the output portion and the respective waveguide respectively aligned with the input portion and the waveguide of the PIC, the carrier attached to the PIC, the carrier supporting the body in the cavity, wherein the protruding region is located in the cavity, and the protruding region comprises a visible region that includes the output portion, the visible region being visible in the cavity adjacent the input portion of the PIC.

6. The device of claim 5, wherein a first plane of the PIC, that includes a waveguide optical axis of the waveguide and is about parallel to mating surfaces of the carrier and the laser device, is aligned with a second plane of the body, that includes a respective waveguide optical axis of the respective waveguide and is about parallel to the mating surfaces of the carrier and the laser device.

7. The device of claim 5, wherein a first plane of the PIC includes a waveguide optical axis of the waveguide, and is about parallel to mating surfaces of the carrier and the laser device, and the device further comprises, at one or more of the given side of the carrier and a respective side of the body attached to the given side, one or more of pedestals and recesses configured to locate the waveguide optical axis at a second plane that aligns with the first plane when the carrier is attached to the PIC, the second plane being about perpendicular to the output portion.

8. The device of claim 7, wherein the one or more of the pedestals and the recesses locate the output portion and the waveguide optical axis at the second plane relative to a surface of the carrier that is attached to the PIC.

9. A method comprising:
burning-in a laser device, the laser device comprising: a laser attached to a carrier, a visible region of the laser, that includes an output portion and at least a portion of a waveguide configured to convey light out of the laser, the visible region being visible to an imaging system external to the laser device the laser comprising: a body supporting components of the laser; a lasing device configured to produce light for a photonic integrated circuit (PIC), the lasing device located between a given side of the carrier and the body; the output portion and the waveguide configured to convey the light from the lasing device out of the laser, a protruding region of the body, supporting the output portion, and the waveguide, protruding an edge of the carrier, the body otherwise having a smaller footprint than the carrier, the output portion located at the protruding region of the body;
positioning, using one or more of the imaging system and a robotic device, the laser device at a surface of the PIC, the PIC comprising a cavity in the surface, such that respective optical axes of the output portion and an input portion of a respective waveguide of the PIC, are about aligned, and such that the body is located in the cavity, wherein the protruding region is located in the cavity, and the protruding region comprises the visible region that includes the output portion, the visible region being visible in the cavity adjacent the input portion of the PIC; and
attaching the carrier to the surface of the PIC.

10. The method of claim 9, further comprising:
prior to attaching the carrier to the surface of the PIC:
moving, using one or more of the imaging system and the robotic device, the laser device to more precisely align the respective optical axes of the output portion and the input portion using a feedback system configured to assist with determining when the output portion and the input portion are aligned; and in response to determining, using the feedback system, that the output portion and the input portion are more precisely aligned, attaching the carrier to the surface of the PIC.

11. The method of claim 10, wherein the feedback system comprises a machine vision system positioned to image one or more of the visible region and alignment features on the visible region, relative to the respective waveguide of the PIC and the method further comprises:
imaging, using the machine vision system, one or more of the visible region and the alignment features relative to the respective waveguide of the PIC, during the moving of the laser device to determine when the output portion and the input portion are more precisely aligned.

12. The method of claim 11, further comprising operating the laser device, during the moving of the laser device to assist the machine vision system with imaging one or more of the visible region and the alignment features relative to the respective waveguide of the PIC.

13. The method of claim 10, wherein the visible region includes alignment features, and the method further comprises:
imaging, using a machine vision system, the alignment features to assist with one or more of: locating, using the imaging system, the laser device at the surface of the PIC; and moving, using the robotic device, the laser device to more precisely align the output portion with the input portion.

14. The method of claim 10, wherein the feedback system comprises one or more of a power measurement device and a light measurement device in optical communication with the input portion via the waveguide, wherein the determining, using the feedback system, that the respective optical axes of the output portion and the input portion are more precisely aligned comprises: determining that an output signal of one or more of the power measurement device and the light measurement device is about maximized at a given location of the laser device relative to the PIC.

15. The method of claim 9, further comprising:
using a polymer waveguide to optically connect the output portion to the input portion.

16. The method of claim 9, wherein attaching the carrier to the surface of the PIC occurs using one or more of a polymer adhesive, a thermoset adhesive and an ultra-violet (UV) adhesive.

17. A device comprising:
a photonic integrated circuit (PIC) including a waveguide and an input portion to the waveguide; and
a laser device attached to the PIC, the laser device comprising: a carrier; a laser attached to the carrier, the laser comprising: a lasing device, a respective waveguide, an output portion, and a visible region of the laser that includes the output portion and at least a portion of the waveguide configured to convey light out of the laser via the output portion to the input portion of the PIC, the output portion and the input portion being optically coupled via an optical coupling device, the visible region being visible to an imaging system external to the laser device,
wherein the input portion to the waveguide and the output portion of the laser device comprise respective facets that are facing in opposite directions, but are not otherwise aligned, the optical coupling device comprising a polymer waveguide which optically couples the respective facets.

* * * * *